US012702057B2

(12) United States Patent
Ecton et al.

(10) Patent No.: US 12,702,057 B2
(45) Date of Patent: Aug. 4, 2026

(54) GLASS CORE PATCHES EMBEDDED IN ENCAPSULATING MATERIAL FOR PACKAGED INTEGRATED CIRCUIT DEVICES

(71) Applicant: Intel Corporation, Santa Clara, CA (US)

(72) Inventors: Jeremy D Ecton, Gilbert, AZ (US); Leonel R. Arana, Phoenix, AZ (US); Brandon C Marin, Chandler, AZ (US); Srinivas Venkata Ramanuja Pietambaram, Chandler, AZ (US); Gang Duan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 399 days.

(21) Appl. No.: 17/481,713

(22) Filed: Sep. 22, 2021

(65) Prior Publication Data

US 2023/0085646 A1    Mar. 23, 2023

(51) Int. Cl.
| | |
|---|---|
| *H10W 90/00* | (2026.01) |
| *H10W 70/05* | (2026.01) |
| *H10W 70/685* | (2026.01) |
| *H10W 70/692* | (2026.01) |
| *H10W 72/00* | (2026.01) |

(Continued)

(52) U.S. Cl.
CPC .......... *H10W 90/00* (2026.01); *H10W 70/05* (2026.01); *H10W 70/095* (2026.01); *H10W 70/685* (2026.01); *H10W 70/692* (2026.01); *H10W 72/0198* (2026.01); *H10W 74/014* (2026.01); *H10W 74/016* (2026.01); *H10W*

*74/47* (2026.01); *H10W 80/00* (2026.01); *H10W 90/794* (2026.01)

(58) Field of Classification Search
CPC ... C09K 11/565; C09K 11/661; C09K 11/665; C09K 11/70; C09K 11/883; G03F 7/0045; H10K 59/1201; H10K 71/13; H10K 59/35; H10K 59/38; H10K 71/211; H10K 50/115
See application file for complete search history.

(56) References Cited

U.S. PATENT DOCUMENTS

2006/0065976 A1    3/2006  Hsuan et al.
2016/0071789 A1    3/2016  Tong et al.
(Continued)

OTHER PUBLICATIONS

Ikehira, Shu. "Novel insulation materials suitable for FOWLP and FOPLP." 2021 IEEE 71st Electronic Components and Technology Conference (ECTC). IEEE, 2021. (Year: 2021).*
(Continued)

*Primary Examiner* — Norman D Richards
*Assistant Examiner* — Ethan Edward Cutler
(74) *Attorney, Agent, or Firm* — Essential Patents Group, LLP

(57)    ABSTRACT

An electronic device comprises a mold layer that includes multiple integrated circuit (IC) dice having contact pads, a glass core patch embedded in encapsulating material that surrounds the top, bottom, and sides of the glass core patch, and a first redistribution layer arranged between the first mold layer and the glass core patch. The first redistribution layer includes electrically conductive interconnect that electrically connects one or more contact pads of the IC dice to the glass core patch.

20 Claims, 5 Drawing Sheets

(51) Int. Cl.
*H10W 74/01* (2026.01)
*H10W 74/47* (2026.01)
*H10W 80/00* (2026.01)

(56) References Cited

U.S. PATENT DOCUMENTS

2020/0027847 A1      1/2020  Limb et al.
2020/0176346 A1*     6/2020  Wu ......................... H01L 25/18
2020/0312767 A1*    10/2020  Pietambaram ........ H01L 23/481
2021/0287977 A1*     9/2021  Mok ....................... H01L 23/13

OTHER PUBLICATIONS

Khazaka, Rabih, et al. "Assessment of dielectric encapsulation for high temperature high voltage modules." 2015 IEEE 65th Electronic Components and Technology Conference (ECTC). IEEE, 2015. (Year: 2015).*
Araujo, L. A. O., et al. "Precision dicing of hard materials with abrasive blade." The International Journal of Advanced Manufacturing Technology 86.9 (2016): 2885-2894. (Year: 2016).*
International Preliminary Report on Patentability from PCT/US2022/073988 notified Apr. 4, 2024, 8 pgs.
"International Application Serial No. PCT US2022 073988, International Search Report mailed Nov. 14, 2022", 4 pgs.
"International Application Serial No. PCT US2022 073988, Written Opinion mailed Nov. 14, 2022", 6 pgs.

* cited by examiner

116

340

104
102
342
344

104

118
116

GLASS CORE PATCHES EMBEDDED IN ENCAPSULATING MATERIAL FOR PACKAGED INTEGRATED CIRCUIT DEVICES

TECHNICAL FIELD

Embodiments pertain to packaging of integrated circuits (ICs). Some embodiments relate to interconnection of ICs using an IC package that includes a glass core.

BACKGROUND

Electronic systems often include integrated circuits (ICs) that are interconnected and packaged as a subassembly. It is desired to integrate multiple types of IC dice into a single electronic package to create an efficient system in a package. There is demand for miniaturization of form factor for such packages yet there is also demand for increased levels of integration for high performance. These demands are driving sophisticated packaging approaches in the semiconductor industry. Die partitioning enables miniaturization of small form factor and can provide high performance without yield issues seen with other methods but needs fine die-to-die interconnections.

Embedded Multi-die Interconnect Bridge (EMIB) enables a lower cost and simpler packaging approach for very high-density interconnects between heterogeneous dice on a single package. In EMIB, instead of an expensive silicon interposer with through silicon vias (TSVs), a small silicon bridge chip is embedded in the package, enabling very high density die-to-die connections only where needed. Standard flip-chip assembly is used for robust power delivery and to connect high-speed signals directly from chip to the package substrate.

Future generations of dice partitioning for electronic packaging may need several bridges that can connect the dice at much finer bump pitches (25 microns or lower) than are currently provided by EMIB packaging. The EMIB approach suffers from a high cumulative Bump Thickness Variation (BTV), and as the number of bridges to be embedded increases, the cost of embedding the IC dice will increase and the yield of EMIB assemblies will decrease.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

To meet the demand for increased functional complexity in smaller devices, manufacturers integrate multiple types of IC dice in a single IC package to create an efficient electronic system in a package. Future generations of electronic packaging will need interconnection for IC dice at much finer bump pitches than is currently available.

An option for enabling fine die-to-die interconnections is to incorporate a thin glass core into the substrate package. A glass core offers several advantages over conventional epoxy cores including a higher plated through hole (PTH) density, lower signal losses, lower total thickness variation (TTV), among others. However, handling a thin glass core (on the order of 400-500 microns) at a panel level (510×515 millimeters) is a significant challenge. Thus, alternative options that do not require repurposing existing substrate manufacturing infrastructure for glass handling of thin glass cores would lead to significant reductions in capital expenditure for manufacturers.

An approach to ease the stringent handling requirements associated with handling of full panel, thin glass cores is to encase an array of glass core patches of arbitrary size (unit sized, quarter panel sized, etc.) within a mold or epoxy or dielectric matrix. By using such an approach, the soft material can accommodate existing substrate manufacturing infrastructure panel handling configurations and manufacturers will still reap the benefits of using glass core in package substrate (e.g., low TTV, good dimensional stability, high PTH density, etc.).

Figure 1:
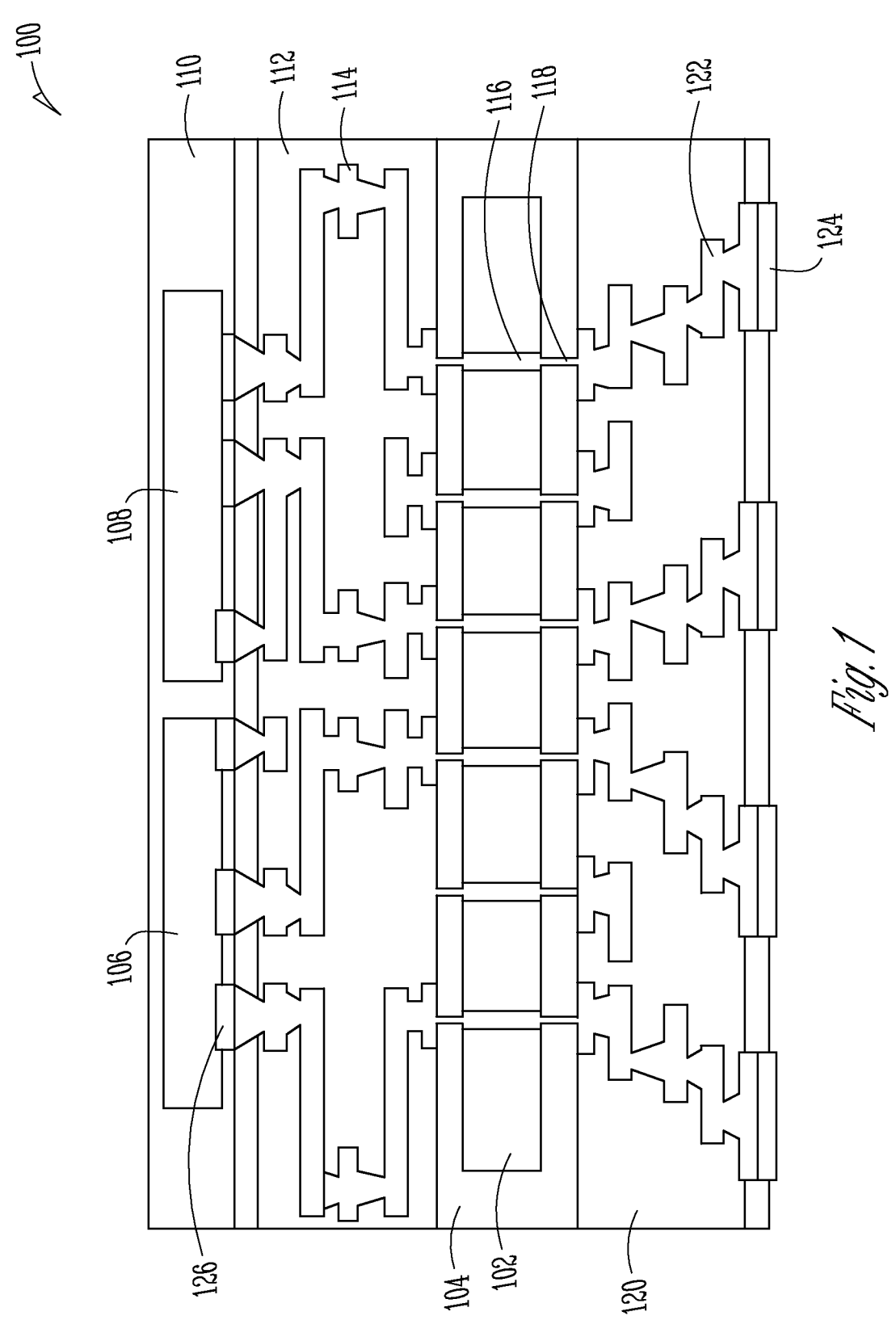
FIG. 1 is an illustration of an example of an electronic system in accordance with some embodiments.

FIG. 1 is an illustration of an example of an electronic system 100 that includes a glass core patch 102. The glass core patch 102 is embedded in an encapsulating material 104. The encapsulating material 104 covers the top side, bottom side, and side walls of the glass core patch 102. The encapsulating material can include one or more of a mold, a dielectric, or an epoxy matrix.

The electronic system 100 includes multiple IC dice. Only two IC dice (106, 108) are shown in the example for simplicity, and an actual implementation may have many IC die. The multiple IC die can include central processing unit tiles and high bandwidth memory tiles. The IC die may be embedded or encapsulated in a mold layer 110 with the contact pads (e.g., I/O pads) of the IC die exposed.

The glass core patch 102 includes through glass vias (TGVs) 116. The TGVs 116 include electrically conductive material (e.g., metal) the extends from the top surface of the glass core patch 102 to the bottom surface of the glass core patch. The encapsulating layer 104 includes through layer vias (TLVs) 118 connected to each end of the TGVs 116. The electronic system 100 also includes a redistribution layer (RDL) 112. The RDL 112 includes a dielectric and one or more layers of electrically conductive interconnect 114. In some examples, the RDL 112 is first layer interconnect (FLI). The electrically conductive interconnect 114 of the RDL 112 electrically connects one or more contact pads 126 of the IC dice to one or more of the TGVs 116 of the glass core patch 102.

The example of FIG. 1 shows a second RDL 120 on the opposite side of the glass core patch 102 from the first RDL 112. The second RDL 120 includes a dielectric and one or more layers of electrically conductive interconnect 122. RDL 120 may be second layer interconnect (SLI). The second RDL 120 connects one or more TGVs 116 of the glass core patch 102 to contact pads 124 of the electronic system 100, which may be used to connect the electronic system 100 to another substrate (not shown) or motherboard. Thus, the IC dice may be connected to the other substrate or motherboard through the glass core patch 102.

Figure 2:
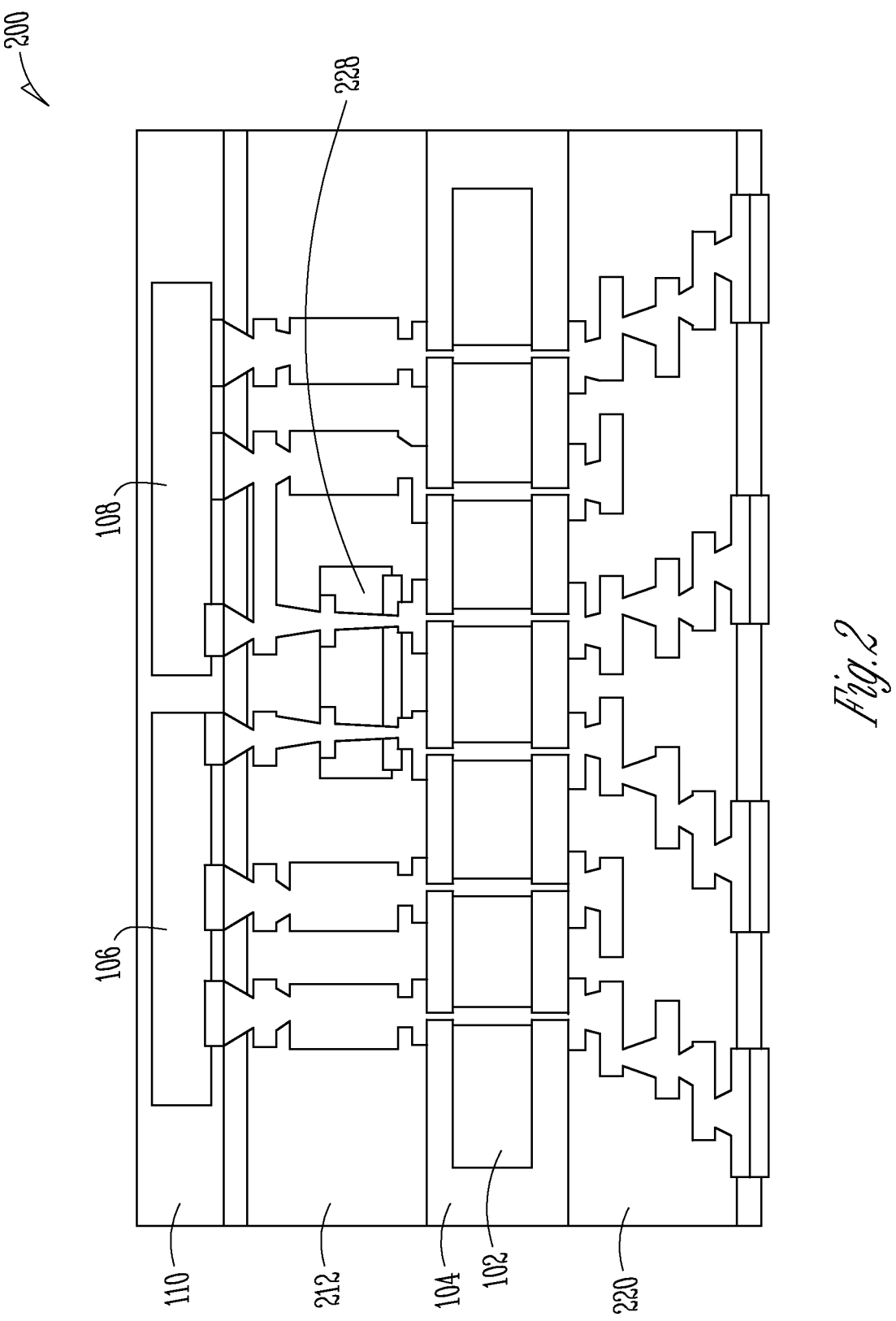
FIG. 2 is an illustration of another example of an electronic system in accordance with some embodiments.

FIG. 2 is an illustration of another example of an electronic system 200. As in the example of FIG. 1, the system 200 includes a glass core patch 102 embedded in encapsulating material 104, a mold layer 110 with IC dice (106, 108), and a first RDL 212 and a second RDL 220. The first RDL 212 includes die-to-die bridge 228 connector. The die-to-die bridge 228 may be an EMIB. The die-to-die bridge 228 provides electrical continuity between at least two of the IC dice. The die-to-die bridge 228 may also provide electrical continuity between the TGVs 116 of the glass core patch 102 and one or more of the IC dice. In some examples, the die-to-die bridge 228 is a silicon interposer.

Figure 3A:
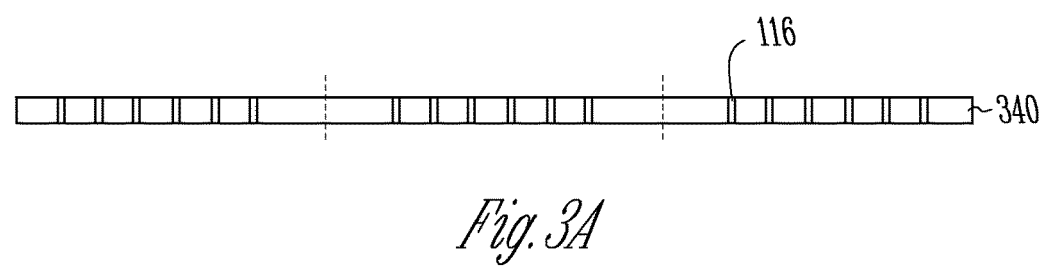
FIGS. 3A-3H illustrate a flow diagram of a method of manufacture of an electronic system in accordance with some embodiments.

FIGS. 3A-3H is a flow diagram of an example of a method of manufacture of an electronic system, such as the electronic system 100 of FIG. 1 or the electronic system 200 of FIG. 2. In FIG. 3A, a glass core 340 is patterned with TGVs 116. The glass of the glass core may be a silicate-based glass (e.g., lithium-silicate, borosilicate, aluminum silicate, etc.). In variations, the glass of the glass core is a lower quality glass (e.g., glass made with soda lime), or a higher quality glass (e.g., glass made with fused silica). To form the TGVs, holes are formed in the glass core 340 (e.g., by etching or laser drilling) and then filled with an electrically conductive material (e.g., by plating the glass core with a metal such as copper or titanium and then planarizing the glass core).

Figure 3B:
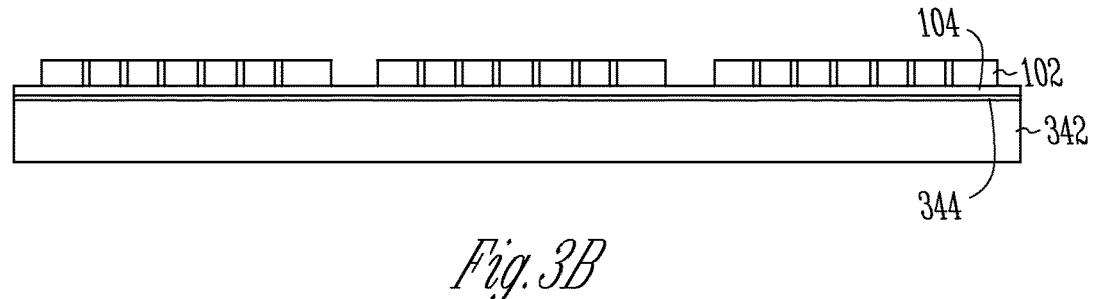

In FIG. 3B, an encapsulating material 104 for the glass core is laminated to a carrier 342. The carrier can be glass and can include a release layer 344. FIG. 3B shows that the glass core 340 is separated into multiple glass core subsections, or glass core patches 102. For example, the glass core may be separated by sawing, which would result in saw marks present on the encapsulating material 104. The glass patches 102 are disposed on the encapsulating material 104 by attaching the bottom surface of the glass core patches 102 to the encapsulating material 104. The glass core patches 102 shown in FIG. 3B are all the same size, but the glass core patches may be different sizes. As described previously herein, the encapsulating material may include one or more of a mold material, a dielectric material, and epoxy.

Figure 3C:
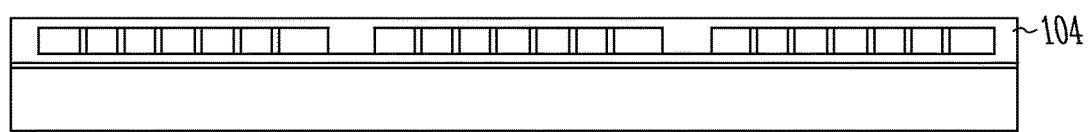
Figure 3D:
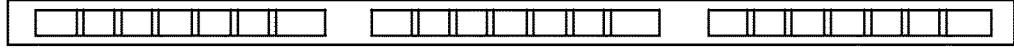

In FIG. 3C, the top surface and side walls of the glass core patches 102 are encapsulated with the encapsulating material 104 in a second lamination. FIG. 3D shows the encapsulated multiple glass core patches 102 removed or released from the carrier 342. The encapsulated multiple glass core patches 102 and the encapsulating material are one piece.

Figure 3E:
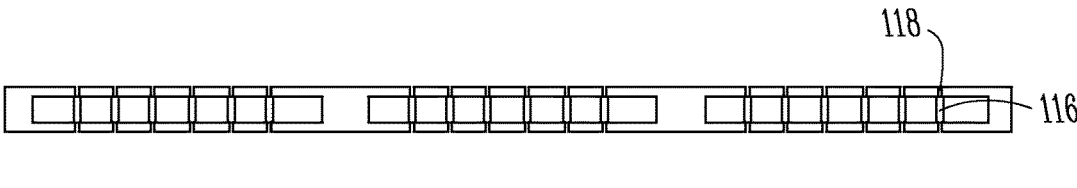

In FIG. 3E, through layer vias 118 are formed in the encapsulating material 104 that connect to the TGVs 116. Holes for the through layer vias 118 can be formed by laser drilling or etching the encapsulating material 104. The holes may be filled with the same electrically conductive material used to fill the TGVs 116. FIG. 3E shows through layer vias formed on both the top side and bottom side of the encapsulated glass core patches 102.

Figures 3F, 3G, 3H:
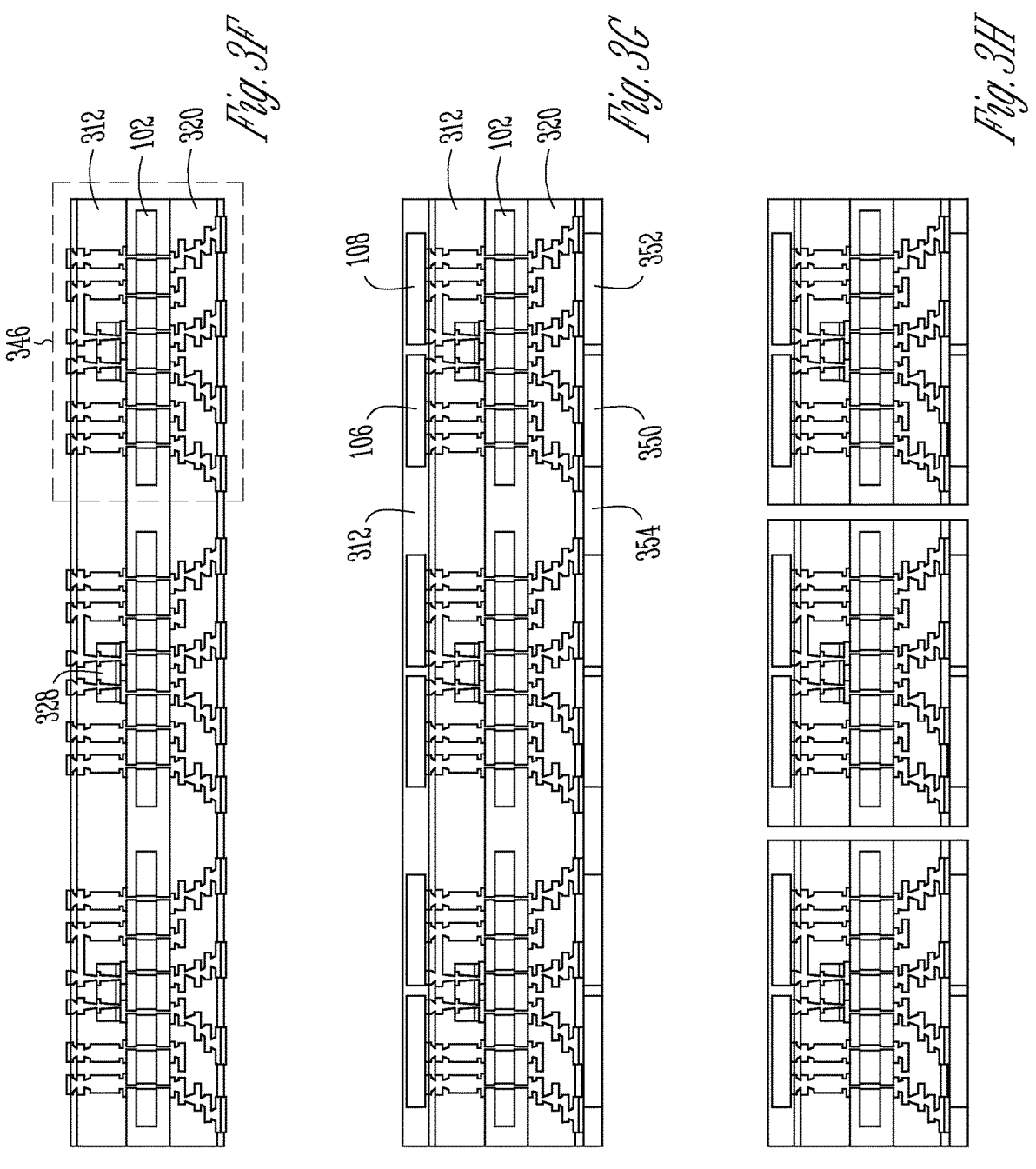

In FIG. 3F, RDLs 312 and 320 are fabricated on the encapsulated glass core patch layer (e.g., using bulk or wafer-level processing). The RDLs 312 shown above the glass core patches 102 may be the FLI and the RDLs shown below the glass core patches 102 may be the SLI or mid-level interconnect (MLI). The RDLs and glass core patches 102 form glass core patch and redistribution layer assemblies 346. The assemblies 346 may have the FLI and the SLI/MLI, or may only have the FLI of RDL 312. In the example shown in the Figures, RDL 312 includes an EMIB 328, but the RDL 312 may not include an EMIB or die-to-die bridge (as in the example of FIG. 1).

In FIG. 3G, IC dice (106, 108, 350, 352) are attached to the RDLs 312 and 320. The IC dice may be embedded in a mold layer 312, 354. In some examples, IC dice are only attached to the top RDL 312 as in FIG. 1. The RDLs include electrically conductive interconnect and provide electrical continuity between pads of the IC dice and the TGVs of the glass core patch. Forming the mold layer may include injection molding underfill of the IC dice. The top of the mold layer may be ground for planarization. In FIG. 3H, the IC dice and glass core patch assemblies are separated into individual units (e.g., by sawing a keep out area between assemblies).

The methods, devices, and systems described herein provide interconnect that can accommodate high frequency signals while providing very dense signal routing. Encapsulating glass core patches is a robust approach for IC packaging, which relaxes the handling requirements for manufacturing. This reduces the need for specialized tooling to fabricate the IC packages.

An example of an electronic device using assemblies with system level packaging as described in the present disclosure is included to show an example of a higher level device application.

Figure 4:
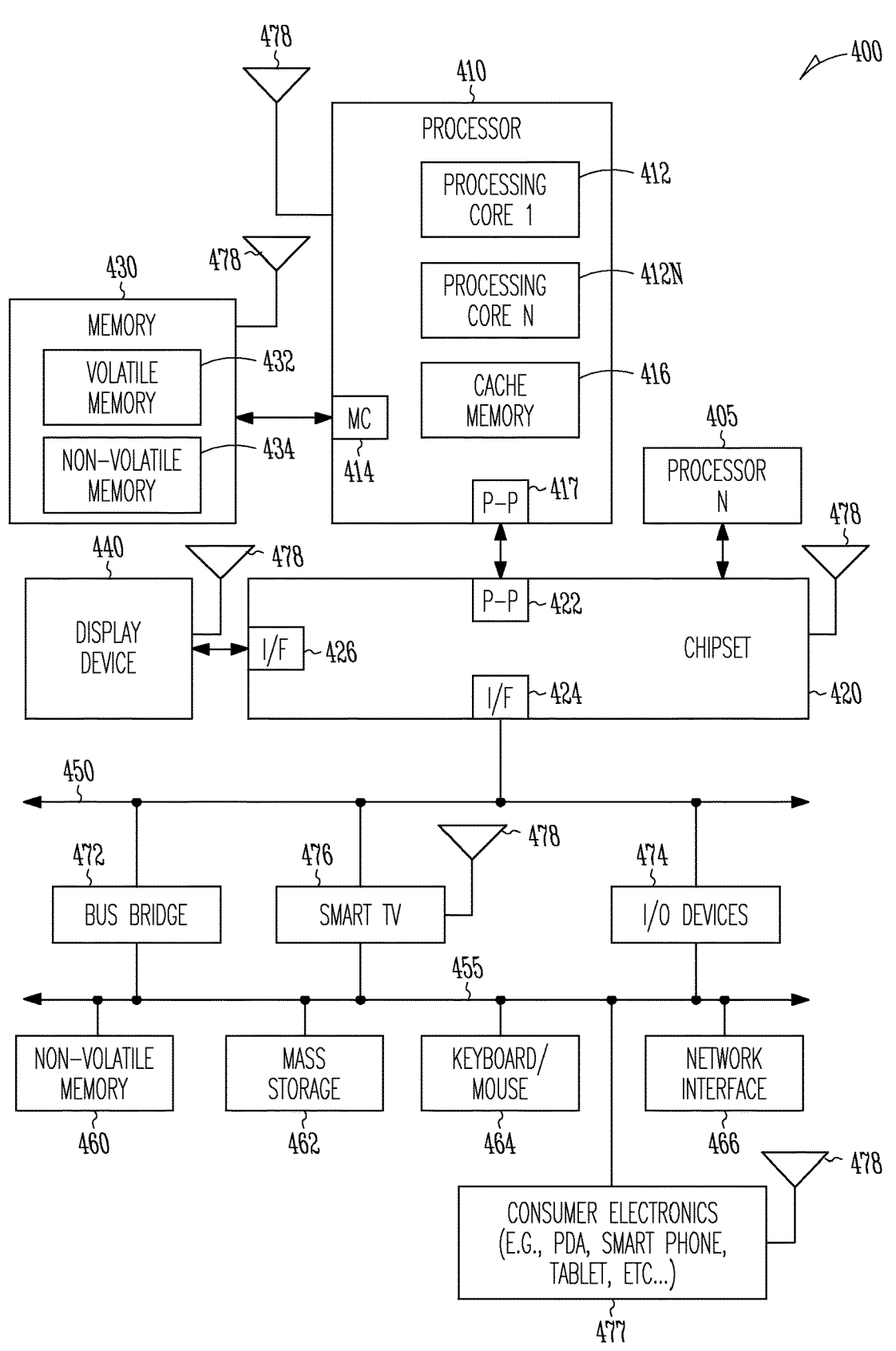
FIG. 4 illustrates a system level diagram in accordance with some embodiments.

FIG. 4 illustrates a system level diagram, according to one embodiment of the invention. For instance, FIG. 4 depicts an example of an electronic device (e.g., system) that can include one or more of stiffening interposers (e.g., glass interposers) as described in the present disclosure. In one embodiment, system 400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some embodiments, system 400 is a system on a chip (SOC) system. In one example, two or more systems as shown in FIG. 4 may be coupled together using one or more glass core patches as described in the present disclosure.

In one embodiment, processor 410 has one or more processing cores 412 and 412N, where N is a positive integer and 412N represents the Nth processor core inside processor 410. In one embodiment, system 400 includes multiple processors including 410 and 405, where processor 405 has logic similar or identical to the logic of processor 410. In some embodiments, processing core 412 includes, but is not limited to, pre-fetch logic to fetch instructions, decode logic to decode the instructions, execution logic to execute instructions and the like. In some embodiments, processor 410 has a cache memory 416 to cache instructions and/or data for system 400. Cache memory 416 may be organized into a hierarchal structure including one or more levels of cache memory.

In some embodiments, processor 410 includes a memory controller 414, which is operable to perform functions that enable the processor 410 to access and communicate with memory 430 that includes a volatile memory 432 and/or a non-volatile memory 434. In some embodiments, processor 410 is coupled with memory 430 and chipset 420. Processor 410 may also be coupled to a wireless antenna 478 to communicate with any device configured to transmit and/or receive wireless signals. In one embodiment, the wireless antenna interface 478 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 434 includes, but is not limited to, flash memory, phase change memory (PCM), read-only memory (ROM), electrically erasable programmable read-only memory (EEPROM), or any other type of non-volatile memory device.

Memory 430 stores information and instructions to be executed by processor 410. In one embodiment, memory 430 may also store temporary variables or other intermediate information while processor 410 is executing instructions. In the illustrated embodiment, chipset 420 connects with processor 410 via Point-to-Point (PtP or P-P) interfaces 417 and 422. Chipset 420 enables processor 410 to connect to other elements in system 400. In some embodiments of the invention, interfaces 417 and 422 operate in accordance with a PtP communication protocol such as the Intel® QuickPath Interconnect (QPI) or the like. In other embodiments, a different interconnect may be used.

In some embodiments, chipset 420 is operable to communicate with processor 410, 405N, display device 440, and other devices 472, 476, 474, 460, 462, 464, 466, 477, etc. Buses 450 and 455 may be interconnected together via a bus bridge 472. Chipset 420 connects to one or more buses 450 and 455 that interconnect various elements 474, 460, 462, 464, and 466. Chipset 420 may also be coupled to a wireless antenna 478 to communicate with any device configured to transmit and/or receive wireless signals. Chipset 420 connects to display device 440 via interface (I/F) 426. Display 440 may be, for example, a liquid crystal display (LCD), a plasma display, cathode ray tube (CRT) display, or any other form of visual display device. In some embodiments of the invention, processor 410 and chipset 420 are merged into a single SOC. In one embodiment, chipset 420 couples with (e.g., via interface 424) a non-volatile memory 460, a mass storage medium 462, a keyboard/mouse 464, and a network interface 466 via I/F 424 and/or I/F 426, I/O devices 474, smart TV 476, consumer electronics 477 (e.g., PDA, Smart Phone, Tablet, etc.).

In one embodiment, mass storage medium 462 includes, but is not limited to, a solid state drive, a hard disk drive, a universal serial bus flash memory drive, or any other form of computer data storage medium. In one embodiment, network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into processor core 412.

The devices, systems, and methods described can provide improved routing of interconnection between ICs for a multichip package in addition to providing improved transistor density in the IC die. Examples described herein include two or three IC die for simplicity, but one skilled in the art would recognize upon reading this description that the examples can include more than three IC die.

ADDITIONAL DESCRIPTION AND EXAMPLES

Example 1 includes subject matter (such as an electronic device) comprising a mold layer that includes multiple integrated circuit (IC) dice having contact pads, a glass core patch embedded in encapsulating material that surrounds the top, bottom, and sides of the glass core patch, and a first redistribution layer arranged between the first mold layer and the glass core patch. The first redistribution layer includes electrically conductive interconnect that electrically connects one or more contact pads of the IC dice to the glass core patch.

In Example 2, the subject matter of Example 1 optionally includes a glass core patch that includes through glass vias (TGVs).

In Example 3, the subject matter of Example 2 optionally includes a first redistribution layer that includes a die-to-die bridge device electrically connected to one or more pads of the IC dice and electrically connected to one or more of the TGVs.

In Example 4, the subject matter of one or both of Examples 2 and 3 optionally include an encapsulating layer that includes through layer vias, with a first through layer via connected to a first end of a TGV, and a second through layer via connected to a second end of the TGV.

In Example 5, the subject matter of one or any combination of Examples 1-4 optionally includes a second redistribution layer arranged on an opposite side of the glass core patch from the first redistribution layer. The first redistribution layer includes first level interconnect, and the second redistribution layer includes one or both of second level interconnect and mid-level interconnect.

In Example 6, the subject matter of one or any combination of Examples 1-5 optionally includes a glass core patch includes silicate glass.

In Example 7, the subject matter of one or any combination of Examples 1-6 optionally includes encapsulating material that includes at least one of a mold material or a dielectric material.

In Example 8, the subject matter of one or any combination of Examples 1-7 optionally includes an encapsulating material that includes epoxy.

Example 9 includes subject matter (such as a method of forming an electronic system) or can optionally by combined with one or any combination of Examples 1-8 to include such subject matter, comprising forming a glass core, patterning the glass core with one or more through glass vias (TGVs), separating the glass core into multiple glass core patches, encapsulating the glass core patches in an encapsulating material, attaching the glass core patches to respective redistribution layers to form glass core patch and redistribution layer assemblies, and dicing to separate the glass core patch and redistribution layer assemblies.

In Example 10, the subject matter of Example 9 optionally includes forming one or more vias in the encapsulating material that connect to the one or more TGVs. The encapsulating material covers a top surface, bottom surface, and sidewalls of each of the glass core patches.

In Example 11, the subject matter of one or both of Examples 9 and 10 optionally includes laminating a carrier with the encapsulating material, placing a bottom side of the glass core patches on the laminated carrier, covering a top side and side walls of the glass core patches with the encapsulating material, and removing the encapsulated glass core patches from the carrier.

In Example 12, the subject matter of one or any combination of Examples 9-11 optionally includes attaching at least one IC die to the respective redistribution layers. The respective redistribution layers provide electrical continuity between at least one pad of the IC die and at least one TGV of a glass core patch.

In Example 13, the subject matter of one or any combination of Examples 9-12 optionally includes separating the glass core into glass core patches of different sizes.

In Example 14, the subject matter of one or any combination of Examples 9-13 optionally includes attaching a first side of the glass core patches to a first level interconnect redistribution layer and connecting the second side of the glass core patches to a second level interconnect redistribution layer or a mid-level interconnect redistribution layer.

In Example 15, the subject matter of one or any combination of Examples 9-14 optionally includes encapsulating the glass core patches with at least one of a dielectric material, a mold material, or an epoxy.

In Example 16, the subject matter of one or any combination of Examples 9-15 optionally includes adding the redistribution layers using bulk processing.

Example 17 includes subject matter (such as a packaged electronic system) or can optionally be combined with one or any combination of Examples 1-16 to include such subject matter, comprising a mold layer that includes multiple integrated circuit (IC) dice, wherein the IC dice include at least one processor die and at least one memory die, an antenna coupled to one or more of the IC dice, a glass core patch layer and a first level interconnect layer. The glass core patch layer includes a glass core patch encapsulated within an encapsulating material and including multiple electrically conductive through glass vias (TGVs), and multiple through layer vias in the encapsulating material contacting the TGVs. The first level interconnect layer is arranged between the mold layer and the glass core patch layer, wherein the first level interconnect layer provides electrical continuity between the through layer vias and pads of the IC dice.

In Example 18, the subject matter of Example 17 optionally includes encapsulating material that covers a top side, a bottom side, and sidewalls of the glass core patch.

In Example 19, the subject matter of one or both of Examples 17 and 18 optionally includes a first level interconnect that includes a die-to-die bridge connector in electrical contact with at least two IC dice of the multiple IC dice and in electrical contact with at least one TGV of the glass core patch.

In Example 20, the subject matter of one or any combination of Examples 17-19 optionally includes a second level interconnect layer, wherein the first level interconnect layer is arranged to contact a first side of the glass core patch layer, and the second interconnect layer is arranged to contact a second side of the glass core patch layer.

These non-limiting examples can be combined in any permutation or combination. The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An electronic device, comprising:
a device layer that comprises multiple integrated circuit (IC) dice embedded in a first mold material, the IC dice each having contact pads;
a core layer that comprises a glass core patch embedded in an encapsulating material that surrounds a top, a bottom, and sides of the glass core patch, the glass core patch comprising through glass vias (TGVs), and the encapsulating material comprising through layer vias; and
a first redistribution layer that comprises electrically conductive interconnects and a discrete silicon interposer embedded in dielectric material that surrounds a top, a bottom, and sides of the discrete silicon interposer, wherein the device layer is on the first redistribution layer and the first redistribution layer is on the encapsulating material of the core layer, the electrically conductive interconnects electrically connect first contact pads of the IC dice to the glass core patch, an entirety of the discrete silicon interposer is above an entirety of the glass core patch, and the discrete silicon interposer electrically connects at least two of the IC dice.

2. The electronic device of claim 1, wherein a first through layer via of the through layer vias is connected to a first end of a first TGV of the TGVs, and a second through layer via of the through layer vias is connected to a second end of the first TGV.

3. The electronic device of claim 1, further comprising:
a second redistribution layer opposite the glass core patch from the first redistribution layer.

4. The electronic device of claim 1, wherein the electrically conductive interconnects are laterally adjacent the discrete silicon interposer.

5. The electronic device of claim 1, wherein a portion of the encapsulating material and a portion of the dielectric material are between the top of the glass core patch and the bottom of the discrete silicon interposer.

6. The electronic device of claim 1, wherein the encapsulating material comprises at least one of a second mold material or a dielectric material.

7. The electronic device of claim 1, wherein the glass core patch comprises silicate glass or fused silica glass, and the glass core patch has a thickness of not more than 500 microns.

8. The electronic device of claim 1, wherein the discrete silicon interposer electrically connects second contact pads of the IC dice to the glass core patch.

9. The electronic device of claim 1, wherein the encapsulating material comprises saw marks.

10. The electronic device of claim 1, further comprising:
an antenna coupled to one or more of the IC dice.

11. An electronic device, comprising:
a device layer comprising multiple integrated circuit (IC) dice in a first mold material, the IC dice each having contact pads;
a core layer comprising a glass core patch in an encapsulating material that surrounds a top, a bottom, and sides of the glass core patch, the glass core patch comprising through glass vias (TGVs), and the encapsulating material comprising through layer vias; and
a first redistribution layer comprising interconnects and a discrete silicon die-to-die bridge in dielectric material that surrounds a top, a bottom, and sides of the discrete silicon die-to-die bridge, wherein the device layer is on the first redistribution layer and the first redistribution layer is on the encapsulating material of the core layer, the interconnects connect first contact pads of the IC dice to the glass core patch, an entirety of the discrete silicon die-to-die bridge is above an entirety of the glass core patch, and the discrete silicon die-to-die bridge connects at least two of the IC dice.

12. The electronic device of claim 11, wherein a first through layer via of the through layer vias is connected to a first end of a first TGV of the TGVs, and a second through layer via of the through layer vias is connected to a second end of the first TGV.

13. The electronic device of claim 11, further comprising:
a second redistribution layer opposite the glass core patch from the first redistribution layer.

14. The electronic device of claim 11, wherein the interconnects are laterally adjacent the discrete silicon die-to-die bridge.

15. The electronic device of claim 11, wherein a portion of the encapsulating material and a portion of the dielectric material are between the top of the glass core patch and the bottom of the discrete silicon die-to-die bridge.

16. The electronic device of claim 11, wherein the encapsulating material comprises at least one of a second mold material or a dielectric material.

17. The electronic device of claim 11, wherein the glass core patch comprises silicate glass or fused silica glass, and the glass core patch has a thickness of not more than 500 microns.

18. The electronic device of claim 11, wherein the discrete silicon die-to-die bridge connects second contact pads of the IC dice to the glass core patch.

19. The electronic device of claim 11, wherein the encapsulating material comprises saw marks.

20. The electronic device of claim 11, further comprising:
an antenna coupled to one or more of the IC dice.

* * * * *